(12) United States Patent
Mori et al.

(10) Patent No.: US 10,396,280 B2
(45) Date of Patent: Aug. 27, 2019

(54) SEMICONDUCTOR MEMORY DEVICE AND MANUFACTURING METHOD FOR SAME

(71) Applicant: TOSHIBA MEMORY CORPORATION, Minato-ku, Tokyo (JP)

(72) Inventors: Shinji Mori, Yokkaichi Mie (JP); Masayuki Tanaka, Yokkaichi Mie (JP); Kazuhiro Matsuo, Kuwana Mie (JP); Kenichiro Toratani, Kuwana Mie (JP); Keiichi Sawa, Yokkaichi Mie (JP); Kazuhisa Matsuda, Yokkaichi Mie (JP); Atsushi Takahashi, Yokkaichi Mie (JP); Yuta Saito, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/695,996

(22) Filed: Sep. 5, 2017

(65) Prior Publication Data

US 2018/0277757 A1 Sep. 27, 2018

(30) Foreign Application Priority Data

Mar. 24, 2017 (JP) .................. 2017-060133

(51) Int. Cl.
*H01L 45/00* (2006.01)
*H01L 27/24* (2006.01)

(52) U.S. Cl.
CPC ........ *H01L 45/1246* (2013.01); *H01L 27/249* (2013.01); *H01L 27/2454* (2013.01);
(Continued)

(58) Field of Classification Search
CPC ............... H01L 27/249; H01L 27/2454; H01L 45/1246; H01L 45/085; H01L 45/146;
(Continued)

(56) References Cited

U.S. PATENT DOCUMENTS 8,822,966 B2   9/2014  Takahashi et al.
9,252,358 B2   2/2016  Kanno et al.
(Continued)

OTHER PUBLICATIONS

Govoreanu, B et al. "Advanced a-VMCO resistive switching memory through inner interface engineering with wide (>102) on/off window, tunable, 1FFD3BCA-range switching current and excellent variability", 2016 Symposium on VLSI Technology Digest of Technical Papers, 3 pages.
(Continued)

*Primary Examiner* — Chuong A Luu
(74) *Attorney, Agent, or Firm* — Foley & Lardner LLP

(57) ABSTRACT

A semiconductor memory device includes a plurality of first interconnections extending in a first direction, and a second interconnection extending in a second direction different from the first direction. The device further includes a resistance change film provided between the plurality of first interconnections and the second interconnection, the resistance change film including (a) silicon and a semiconductor layer including one or more elements selected from among oxygen, carbon, nitrogen, phosphorus, boron, and germanium, or (b) a first layer containing the germanium and a second layer containing the silicon.

11 Claims, 9 Drawing Sheets

(52) U.S. Cl.
CPC ............ *H01L 45/08* (2013.01); *H01L 45/085* (2013.01); *H01L 45/1226* (2013.01); *H01L 45/146* (2013.01); *H01L 45/16* (2013.01); *H01L 45/1616* (2013.01)

(58) Field of Classification Search
CPC ..... H01L 45/1616; H01L 45/00; H01L 45/08; H01L 45/04; H01L 45/16; H01L 45/1226; H01L 45/1233; H01L 45/1253; H01L 45/1266; H01L 27/2463
USPC .......................................................... 257/5
See application file for complete search history.

(56) References Cited

U.S. PATENT DOCUMENTS

| | | | |
|---|---|---|---|
| 2013/0328008 A1* | 12/2013 | Miyagawa | ............ H01L 45/085 257/4 |
| 2013/0337628 A1* | 12/2013 | Sonehara | ............ G11C 13/0002 438/382 |
| 2014/0061577 A1* | 3/2014 | Kanno | .................... H01L 45/04 257/5 |
| 2014/0192589 A1* | 7/2014 | Maxwell | ............ G11C 13/0002 365/148 |
| 2015/0263034 A1 | 9/2015 | Higuchi et al. | |
| 2016/0276539 A1* | 9/2016 | Kaga | ....................... H01L 33/44 |

OTHER PUBLICATIONS

Govoreanu, B et al., "a-VMCO: a novel forming-free, self-rectifying, analog memory cell with low-current operation, nonfilamentary switching and excellent variability", 2015 Symposium on VLSI Technology Digest of Technical Papers, 2 pages.

\* cited by examiner

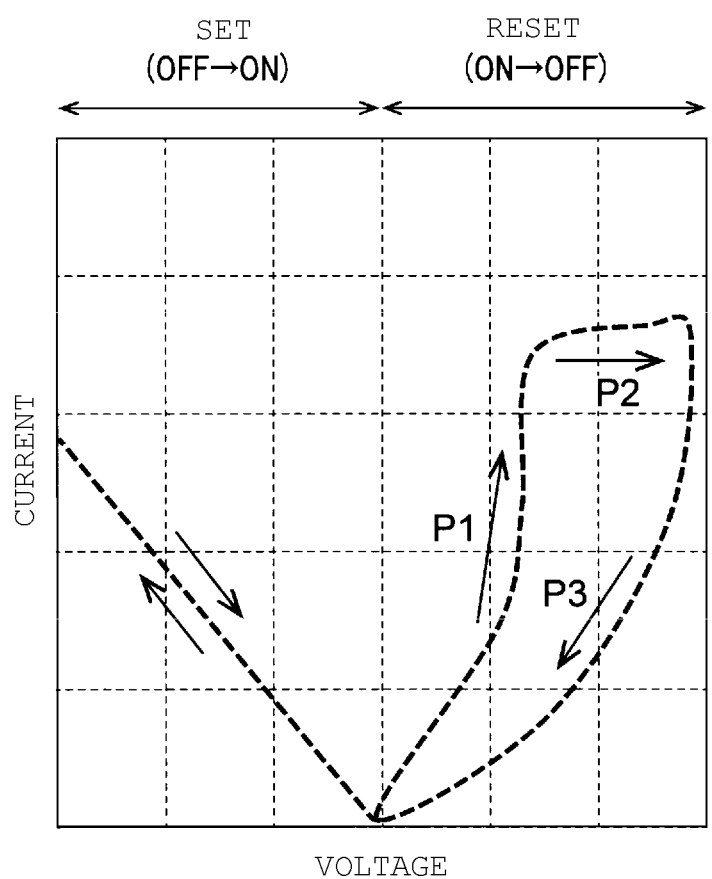

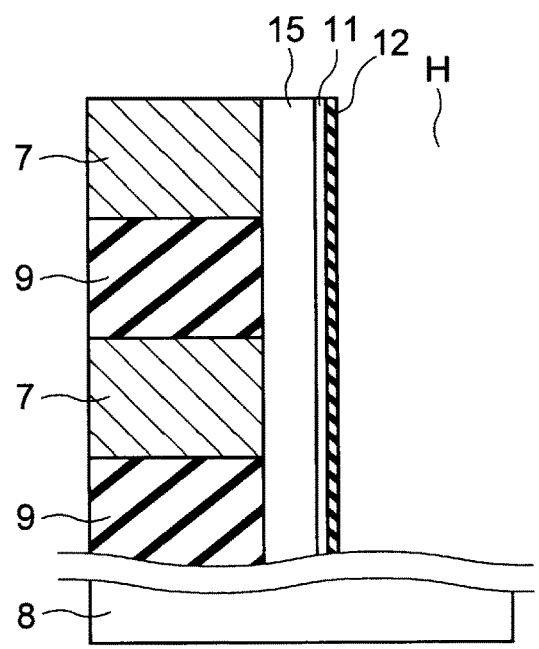
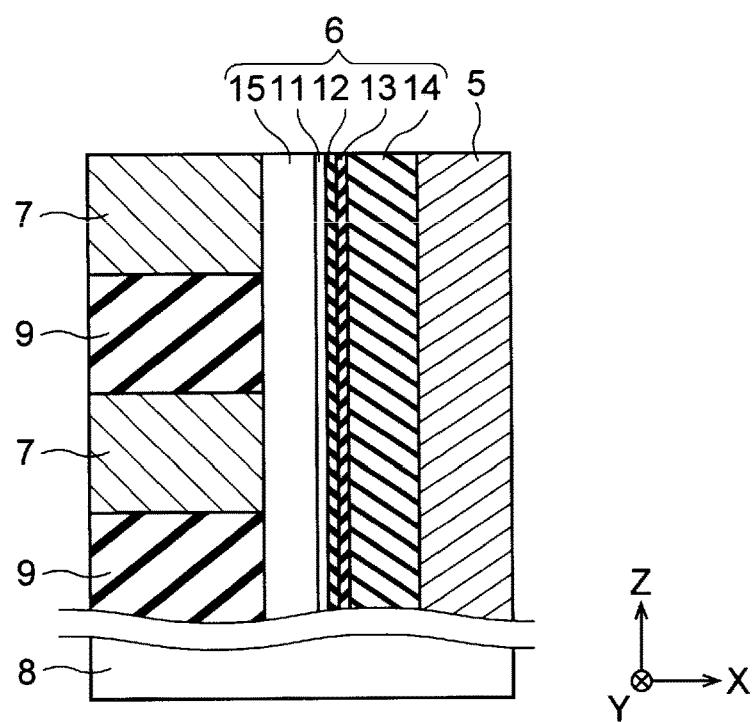

SEMICONDUCTOR MEMORY DEVICE AND MANUFACTURING METHOD FOR SAME

CROSS-REFERENCE TO RELATED APPLICATION

This application claims the benefit of and priority to Japanese Patent Application No. 2017-060133, filed Mar. 24, 2017, the entire contents of which are incorporated herein by reference.

FIELD

Embodiments described herein relate generally to a semiconductor memory device and a manufacturing method for the same.

BACKGROUND

In a resistive random access memory implemented in a three-dimensional structure, a plurality of word lines extending in a horizontal direction are connected to a same resistance change film (e.g. a film having a resistance state that changes depending on a supplied voltage or current) extending in a vertical direction. A resistance change film implemented in such a manner could cause problems including a leak current between the word lines, diffusion of metal atoms from the word lines, low concentration of ions in the resistance change film, and degradation of endurance characteristics of the resistance change film.

DESCRIPTION OF THE DRAWINGS

FIG. 6 is a graph showing example operating characteristics of the semiconductor memory device according to the first aspect.

FIG. 10A and FIG. 10B are cross-sectional views illustrating some embodiments of a manufacturing method for the semiconductor memory device according to the second aspect.

DETAILED DESCRIPTION

Figure 1:
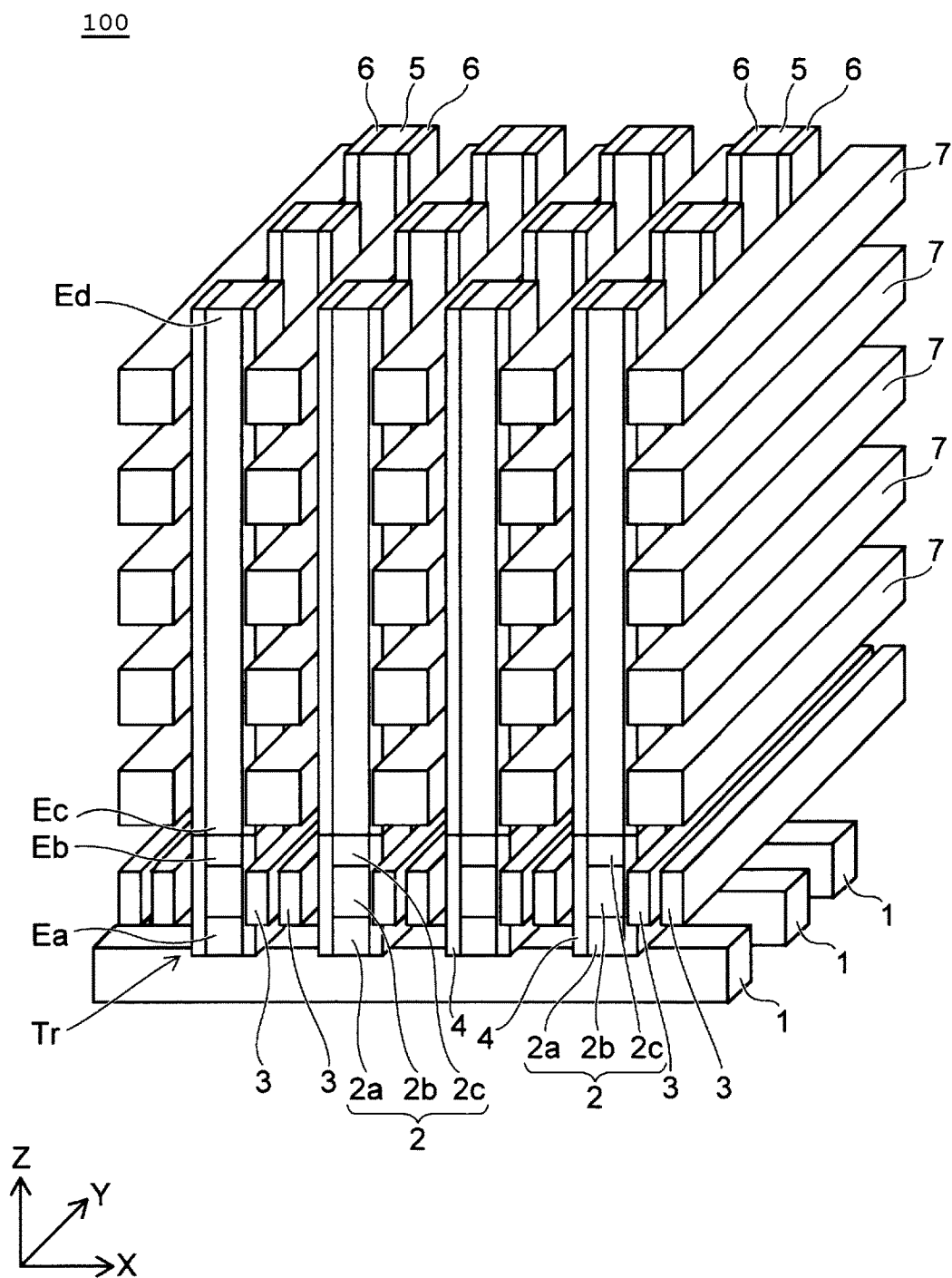
FIG. 1 is a perspective view illustrating some embodiments of a structure of a semiconductor memory device according to a first aspect.

Some example embodiments provide for a semiconductor memory device including a resistance change film exhibiting advantageous characteristics and a manufacturing method for the same.

In some embodiments, according to one aspect, a semiconductor memory device includes a plurality of first interconnections extending in a first direction, and a second interconnection extending in a second direction different from the first direction. The device further includes a resistance change film provided between the plurality of first interconnections and the second interconnection, the resistance change film including (a) silicon and a semiconductor layer including one or more elements selected from among oxygen, carbon, nitrogen, phosphorus, boron, and germanium, or (b) a first layer including germanium and a second layer including silicon.

In some embodiments, according to another aspect, a manufacturing method for a semiconductor memory device includes forming a plurality of first interconnections extending in a first direction, and forming a resistance change film on side surfaces of the first interconnections. The method further includes forming a second interconnection extending in a second direction different from the first direction on a side surface of the resistance change film. The resistance change film includes (a) silicon and a semiconductor layer including one or more types of elements selected from among oxygen, carbon, nitrogen, phosphorus, boron, and germanium, or (b) a first layer including germanium and a second layer including silicon.

Embodiments of the present disclosure will be described hereinafter with reference to the drawings. In FIG. 1 through FIG. 10, same or similar constituent elements are denoted by same reference signs and repetitive description may be omitted.

In the following description, an XYZ orthogonal coordinate system is used for convenience of explanation. In this coordinate system, two directions orthogonal to each other are referred to as an X direction and a Y direction, and a direction orthogonal to both the X direction and the Y direction is referred to as a Z direction. While the drawings depict a +Z direction as an upward direction and a −Z direction as a downward direction, the −Z direction need not correspond to a direction of gravitational acceleration, and the depicted embodiments may be oriented differently than as shown in the drawings.

(First Aspect)

FIG. 1 is a perspective view illustrating some embodiments of a structure of a semiconductor memory device 100 according to a first aspect. The semiconductor memory device shown in FIG. 1 is a resistive random access memory implemented in a three-dimensional structure.

The semiconductor memory device 100 shown in FIG. 1 includes a plurality of global bit lines 1. The global bit lines 1 may constitute, for example, part of a silicon substrate or a polysilicon layer provided on the silicon substrate via an insulating film. In some embodiments, an element isolation insulating film is disposed between the global bit lines 1.

FIG. 1 shows an X direction and a Y direction parallel to a surface of a substrate and perpendicular to each other, and a Z direction perpendicular to the surface of the substrate. The global bit lines 1 extend in the X direction and are disposed along the Y direction.

A plurality of semiconductor members 2 are disposed on each global bit line 1. The semiconductor members are arranged with the global bit lines 1 in a matrix configuration along the X and Y directions. Reference signs 2a and 2c denote a lower end n-type section and an upper end n-type section of each semiconductor member 2, respectively. The lower end 2a of each semiconductor member 2 is electrically connected to one global bit line 1.

Each semiconductor member 2 includes the n-type section 2a disposed on one global bit line 1, a p-type section 2b disposed on the n-type section 2a, and the n-type section 2c disposed on the p-type section 2b. The n-type section 2a, the p-type section 2b, and the n-type section 2c constitute, for example, at least a portion of a polysilicon layer. In some embodiments according to the first aspect, the n-type sections 2a and 2c may be replaced by p-type sections and the p-type section 2b may be replaced by an n-type section.

The semiconductor memory device 100 shown in FIG. 1 further includes a plurality of gate electrodes 3 extending between the semiconductor members 2 in the Y direction. The gate electrodes 3 constitute, for example, at least a portion of a polysilicon layer. Each gate electrode 3 is provided adjacent to (e.g. at +X-direction side surfaces or −X-direction side surfaces) at least an upper portion of the n-section 2a, of the p-section 2b (e.g. the entirety of the p-section 2b), and at least a lower portion of the n-section 2c via a gate insulating film 4.

The gate insulating films 4 are disposed on a +X-direction side surface and a −X-direction side surface of each semiconductor member 2, respectively. The gate insulating films 4 include, for example, silicon oxide films. One semiconductor member 2, a pair of gate electrodes 3, and the gate insulating film 4 between the semiconductor member 2 and the pair of gate electrodes 3 constitute an n-channel TFT (Thin Film Transistor) as indicated by reference sign Tr. This TFT is a switching device that can provide for switching between conduction and cutoff of a current.

One local bit line 5 extending in the Z direction and having, for example, a pillar shape is disposed on each semiconductor member 2. The local bit line 5 includes, for example, a titanium nitride film (TiN). Reference signs Ec and Ed denote a lower end and an upper end of each local bit line 5, respectively. The lower end Ec of each local bit line is electrically connected to the upper end 2c of one semiconductor member 2. The local bit line 5 may be referred to herein as a second interconnection and the Z direction may be referred to herein as a second direction.

A resistance change film 6 is disposed on each of a +X-direction side surface and a −X-direction side surface of each local bit line 5. The resistance change film 6 is a film having a resistance state that changes depending on a supplied voltage or current. The resistance change film 6 is described below in detail.

Furthermore, the semiconductor memory device 100 shown in FIG. 1 includes a plurality of word lines 7 extending between the local bit lines 5 in the Y direction. A plurality of word lines 7 disposed along the Z direction are disposed between local bit lines 5 that are adjacent to each other in the X direction. The word lines 7 include, for example, a titanium nitride film. The resistance change films 6 are each disposed between one local bit line 5 and a plurality of the word lines 7. The word lines 7 may be referred to herein as first interconnections and the Y direction may be referred to herein as a first direction.

Figure 2:
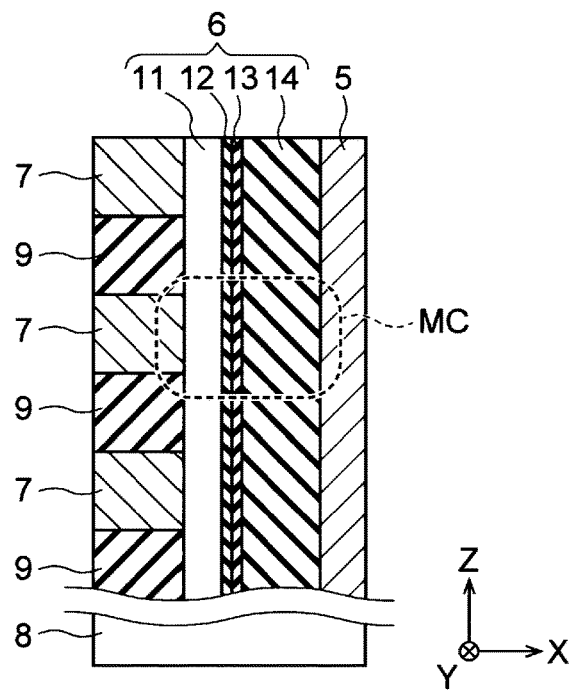
FIG. 2 is a cross-sectional view illustrating some embodiments of the structure of the semiconductor memory device according to the first aspect.

FIG. 2 is a cross-sectional view illustrating some embodiments of a structure of the semiconductor memory device 100 according to the first aspect.

FIG. 2 shows a substrate 8, a plurality of interlayer insulating films 9 and the plurality of word lines 7 alternately stacked above the substrate 8, and one local bit line 5 provided on side surfaces of the interlayer insulating films 9 and of the word lines 7 via one resistance change film 6. Memory cells MC are constituted at least in part by an intersecting part between each word line 7 and the local bit line 5. The substrate 8 is, for example, a semiconductor substrate such as a silicon substrate. The interlayer insulating films 9 are each, for example, silicon oxide films ($SiO_2$).

As shown in FIG. 2, the resistance change film 6 includes a first barrier layer 11, a second barrier layer 12, a third barrier layer 13, and a switching layer 14 provided in that order on the side surface of the interlayer insulating films 9 and of the word lines 7.

The first barrier layer 11 is, for example, a semiconductor layer such as an amorphous silicon layer and has a thickness of about five nanometers (nm). The second barrier layer 12 is, for example, a non-metal oxide film such as a silicon oxide film and has a thickness of about one nm. The third barrier layer 13 is, for example, a metal oxide film such as an aluminum oxide film ($AlO_x$) and has a thickness of about one nm. The second barrier layer 12 and the third barrier layer 13 may be referred to herein as "intermediate layers". It is noted that the materials and thicknesses of the first to third barrier layers 11 to 13 are not limited to the examples described above, and may vary from the described examples as appropriate.

The switching layer 14 includes a material having a high conductivity and a narrow band gap. The switching layer 14 according to the first aspect is formed from a material higher in conductivity and narrower in band gap than is the case for the materials of the second barrier layer 12 and the third barrier layer 13. The switching layer 14 is, for example, a metal oxide film such as a titanium oxide film ($TiO_x$) and has a thickness of about ten nm. It is noted that the material and the thickness of the switching layer 14 are not limited to the examples described above, and may vary from the described examples as appropriate.

When a voltage is applied to the resistance change film 6, oxygen ions are introduced into the switching layer 14 from the first through third barrier layers 11 to 13. As a result, a band structure of the resistance change film 6 changes and the resistance state of the resistance change film 6 changes. A region exhibiting the most change may be located near the third barrier layer 13 in the switching layer 14.

Figure 3:
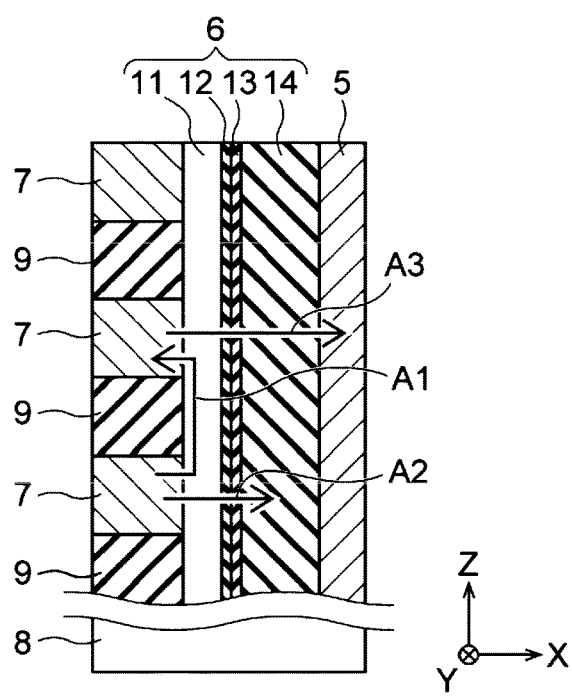
FIG. 3 is a cross-sectional view showing some characteristics of the semiconductor memory device according to the first aspect.

FIG. 3 is a cross-sectional view showing some characteristics of the semiconductor memory device 100 according to the first aspect in detail.

The first barrier layer 11 according to the first aspect is a semiconductor layer including impurities; and in some embodiments the first barrier layer 11 is a silicon layer including, as the impurities, one or more types of elements selected from among oxygen (O), carbon (C), nitrogen (N), phosphorus (P), boron (B), and germanium (Ge). Such a first barrier layer 11 is formed by, for example, doping the silicon layer with the impurities.

For example, when the first barrier layer 11 is doped with oxygen, carbon or nitrogen, it is possible to increase a resistivity of the first barrier layer 11 and to reduce a leak current (indicated by arrow A1) between the word lines 7. In addition, when the first barrier layer 11 is doped with oxygen, carbon, or nitrogen, it is possible to suppress diffusion of metal atoms from the word lines 7 (indicated by arrow A2) and to improve a breakdown voltage of a memory cell that includes the first barrier layer 11.

In these cases, the first barrier layer 11 may include two or more types of elements selected from among oxygen, carbon, and nitrogen. It is thereby possible to increase and/or adjust, for example, the resistivity and the breakdown voltage. Alternatively, the first barrier layer 11 may be configured with a plurality of silicon layers including oxygen, carbon or nitrogen, or may be configured with a first silicon layer including oxygen, carbon or nitrogen and a second silicon layer that does not include the same combination of elements (e.g. omits oxygen, carbon or nitrogen).

In embodiments in which the first barrier layer 11 is doped with phosphorus, boron or germanium, it is possible to reduce the resistivity of the first barrier layer 11 and overcome issues associated with a low concentration of oxygen ions in the resistance change film 6 (indicated by arrow A3).

In this case, the first barrier layer 11 may include two types or more of elements among phosphorus, boron, and germanium. It is thereby possible to increase and/or adjust, for example, an ion feed rate. Alternatively, the first barrier layer 11 may be configured with a plurality of silicon layers including phosphorus, boron or germanium, or may be configured with a first silicon layer including phosphorus, boron or germanium and a second silicon layer that omits those elements.

Furthermore, the first barrier layer 11 according to the first aspect may include one or more types of elements selected from among oxygen, carbon, and nitrogen and one or more types of elements selected from among phosphorus, boron, and germanium. For example, the first barrier layer 11 may be configured with the first silicon layer including oxygen, carbon or nitrogen, and the second silicon layer including phosphorus, boron or germanium.

Figure 4A:
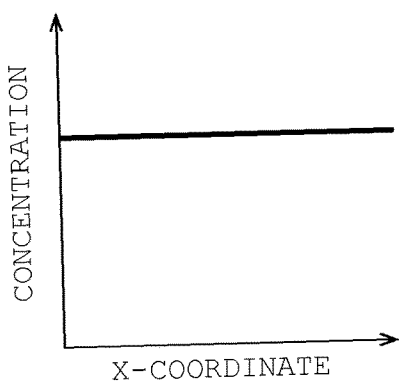
FIG. 4A, FIG. 4B and FIG. 4C are graphs illustrating examples of a concentration profile of an impurity element included in a first barrier layer according to the first aspect.
Figure 4B:
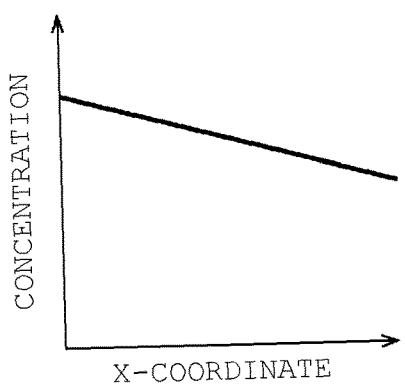
Figure 4C:
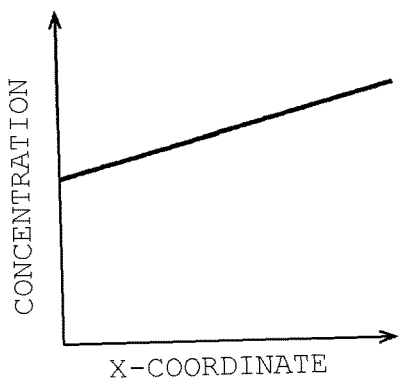

FIG. 4A through FIG. 4C are graphs illustrating examples of a concentration profile of an impurity element included in the first barrier layer 11 according to the first aspect.

A horizontal axis of each graph represents an X-coordinate within the first barrier layer 11 with respect to the configuration shown in FIG. 3. An increase along the X coordinate thus represents an increased distance of a portion of the first barrier layer 11 from the word lines 7. A decrease of the X-coordinate represents a decreased distance of a portion of the first barrier layer 11 from the word lines 7. A vertical axis of each graph represents a concentration of one type of impurity atoms (for example, oxygen atoms, or atoms of one of the other elements discussed above) included in the first barrier layer 11.

FIG. 4A illustrates an example in which the impurity concentration does not change (e.g. is substantially constant) when the X-coordinate changes. FIG. 4B illustrates an example in which the impurity concentration decreases as the X-coordinate increases. FIG. 4C illustrates an example in which the impurity concentration increases as the X-coordinate increases. According to the first aspect, a first barrier layer 11 in accordance with any of the depicted relationships may be implemented. In some embodiments, the concentration profile in which the impurity concentration changes provides for some advantages as will be described with reference to FIG. 5A through FIG. 5C.

These concentration profiles are also applicable to a case in which the first barrier layer 11 includes two or more types of impurities. For example, when the first barrier layer 11 includes oxygen and nitrogen, then the concentration profile shown in FIG. 4C may be implemented as that of oxygen, and the concentration profile shown in FIG. 4C may be also implemented as that of nitrogen.

Figure 5A:
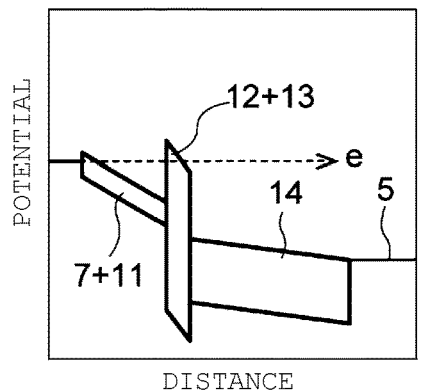
FIG. 5A, FIG. 5B and FIG. 5C are graphs illustrating examples of a band structure of the semiconductor memory device according to the first aspect.
Figure 5B:
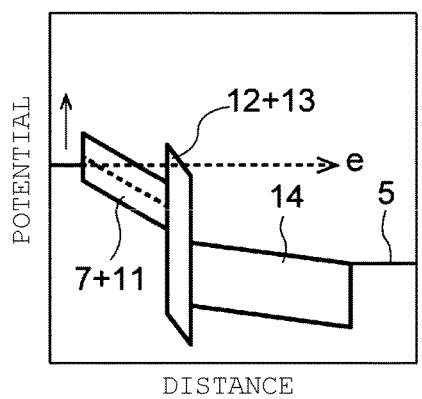
Figure 5C:
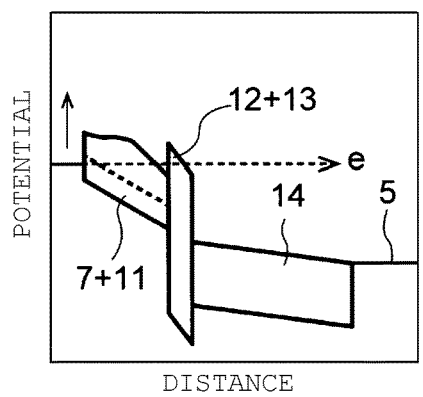

FIG. 5A through FIG. 5C are graphs illustrating examples of a band structure of the semiconductor memory device 100 according to the first aspect.

Each graph indicates a relationship between a distance from the word line 7 (ranging from the word line 7 to the local bit line 5) and a corresponding potential. In each graph, reference signs 7, 11, 12, 13, 14, and 5 denote potentials corresponding to the word line 7, the first barrier layer 11, the second barrier layer 12, the third barrier layer 13, the switching layer 14, and the local bit line 5, respectively.

FIG. 5A illustrates an example of the band structure when the first barrier layer 11 does not include impurities. FIG. 5B illustrates an example of the band structure when the first barrier layer 11 includes oxygen and nitrogen as the impurities. It can be understood from these examples that doping the first barrier layer 11 with oxygen and nitrogen increases a band offset of the first barrier layer 11, raising a corresponding potential. It is thereby possible to reduce the leak current between the word lines 7.

FIG. 5C illustrates another example of the band structure when the first barrier layer 11 includes oxygen and nitrogen as the impurities. In this case, the concentration profile shown in FIG. 4C is implemented as that of oxygen and the concentration profile shown in FIG. 4C is implemented as that of nitrogen. It can be understood from this example that doping the first barrier layer 11 with oxygen and nitrogen having concentration changes further increases the band offset of the first barrier layer 11, raising the corresponding potential even higher than that depicted in FIG. 5B. It is thereby possible to further reduce the leak current between the word lines 7.

FIG. 6 is a graph showing operating characteristics of the semiconductor memory device 100 according to the first aspect.

A horizontal axis of FIG. 6 represents a voltage between a word line 7 and an adjacent local bit line 5 of the semiconductor memory device 100. A vertical axis of FIG. 6 represents a current carried between the word line 7 and the local bit line 5.

Arrows P1, P2 and P3 denote a hysteresis of current-voltage characteristics during resetting of a memory cell that includes the word line 7 and the adjacent local bit line 5 in a case in which the first barrier layer 11 includes phosphorus, boron or germanium. In some embodiments according to the first aspect, it is possible to provide for an on-operation at a low resistance as indicated by arrows P1 and P2 and an off-operation at a high resistance as indicated by arrow P3.

Figure 7A:
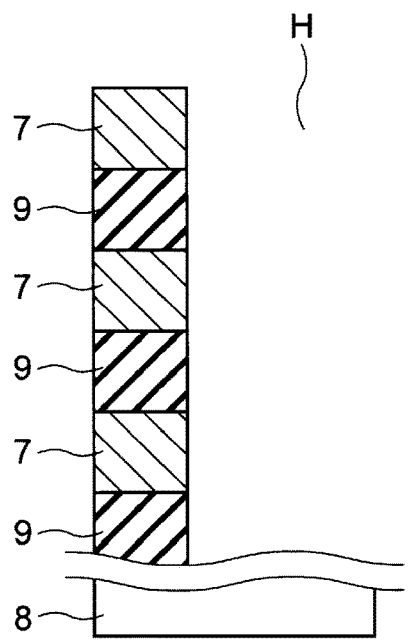
FIG. 7A and FIG. 7B are cross-sectional views illustrating a manufacturing method for the semiconductor memory device according to the first embodiment.
Figure 7B:
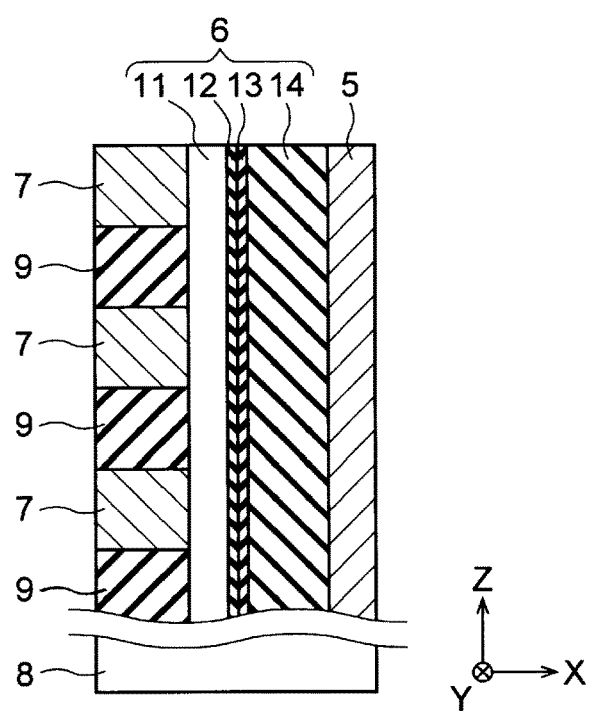

FIG. 7A and FIG. 7B are cross-sectional views illustrating a manufacturing method for the semiconductor memory device 100 according to the first aspect.

First, a plurality of silicon oxide films for the interlayer insulating films 9 and a plurality of titanium nitride films for the word lines 7 are alternately stacked above the substrate 8 (FIG. 7A). Next, openings H (e.g. openings disposed along the X direction) penetrating the silicon oxide films and the titanium nitride films are formed by etching (FIG. 7A). As a result, the silicon oxide films and the titanium nitride films are each processed into a pillar shape extending in the Y direction and the Z direction, and the word lines 7 extending in the Y direction are formed.

Next, the first barrier layer 11, the second barrier layer 12, the third barrier layer 13, the switching layer 14, and a titanium nitride film for the local bit line 5 are formed in that order on the side surfaces of the interlayer insulating films 9 and of the word lines 7 (FIG. 7B).

At this time, the first barrier layer 11 is formed by low pressure chemical vapor deposition (LPCVD) using a first source gas including silicon and a second source gas including one or more types of elements selected from among oxygen, carbon, nitrogen, phosphorus, boron, and germanium. This can provide for doping the silicon layer that serves as the first barrier layer 11 with one or more of the abovementioned elements. The first source gas and the second source gas may be supplied into a chamber for the LPCVD either simultaneously or at different times.

Examples of the first source gas include $Si_2H_6$ gas, $SiH_4$ gas, $SiH_2Cl_2$ gas, and $Si_2Cl_6$ gas (where Si represents silicon, H represents hydrogen and Cl represents chlorine).

Examples of the second source gas used for doping the first barrier layer 11 with oxygen include $O_2$ gas, $O_3$ gas, $N_2O$ gas, NO gas, and CO gas.

Examples of the second source gas used for doping the first barrier layer 11 with the carbon include $CH_4$ gas, $C_2H_6$ gas, $C_3H_8$ gas, $C_4H_{10}$ gas, $C_2H_4$ gas, $C_3H_6$ gas, $C_4H_8$ gas, $SiH_3CH_3$ gas, $SiH_2(CH_3)_2$ gas, and $SiH(CH_3)_3$ gas.

Examples of the second source gas for doping the first barrier layer 11 with the nitrogen includes $NH_3$ gas and $N_2$ gas. The $N_2$ gas may include radicals.

Examples of the second source gas for doping the first barrier layer 11 with phosphorus, boron or germanium include $PH_3$ gas, $B_2H_6$ gas, and $GeH_4$ gas.

It is noted that the first barrier layer 11 may be formed by other methods. The first barrier layer 11 may be formed by, for example, plasma CVD, thermal oxidation of the silicon layer or nitriding of the silicon layer.

Subsequently, openings (e.g. opening disposed along the Y direction) penetrating the first barrier layer 11, the second barrier layer 12, the third barrier layer 13, the switching layer 14, and the titanium nitride film for the local bit line 5 are formed by etching. As a result, these layers are each processed into a pillar shape extending in the Z direction, and the local bit lines 5 extending in the Z direction are formed (see FIG. 1). Various insulating films and interconnection layers are then formed on the substrate 8, thus manufacturing the semiconductor memory device 100 according to the first aspect.

As described above, the first barrier layer 11 according to the first aspect is formed as the semiconductor layer including silicon and one or more types of elements selected from among oxygen, carbon, nitrogen, phosphorus, boron, and germanium. Owing to this, according to the first aspect, it is possible to address problems including the leak current between the word lines 7, the diffusion of metal atoms from the word lines 7, and the low concentration of ions in the resistance change film 6 by implementing appropriate elements.

For example, doping the first barrier layer 11 with oxygen, carbon or nitrogen can increase the resistivity of the first barrier layer 11 and reduce the leak current between the word lines 7. In addition, doping the first barrier layer 11 with oxygen, carbon or nitrogen can suppress the diffusion of metal atoms from the word lines 7 and improve the breakdown voltage of the memory cell. Meanwhile, doping the first barrier layer 11 with phosphorus, boron or germanium can reduce the resistivity of the first barrier layer 11 and overcome the low concentration of oxygen ions in the resistance change film 6.

Hence, according to the first aspect, it is possible to realize the semiconductor memory device 100 with the resistance change film 6 exhibiting advantageous characteristics by implementing the first barrier layer 11 as described above.

(Second Aspect)

Figure 8:
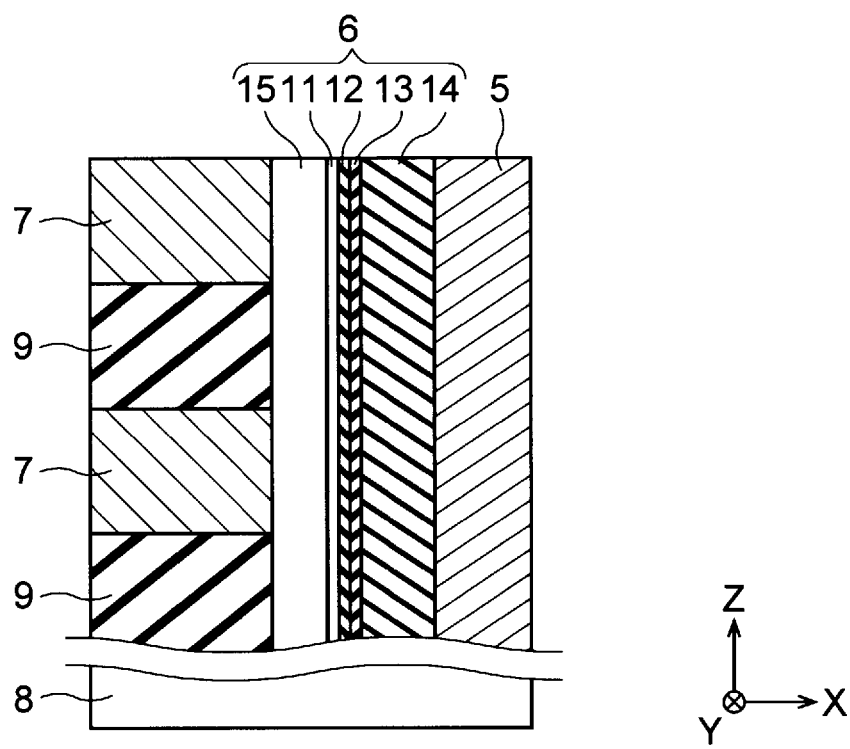
FIG. 8 is a cross-sectional view illustrating some embodiments of a structure of a semiconductor memory device according to a second aspect.

FIG. 8 is a cross-sectional view illustrating a structure of a semiconductor memory device 200 according to a second aspect.

In the semiconductor memory device 200 shown in FIG. 8, the resistance change film 6 includes a fourth barrier layer 15 in addition to the components shown in FIG. 2. Specifically, the resistance change film 6 includes the fourth barrier layer 15, the first barrier layer 11, the second barrier layer 12, the third barrier layer 13, and the switching layer 14 provided in that order on the side surfaces of the interlayer insulating films 9 and of the word lines 7.

As described above, each of the first and second barrier layers 11 and 12 include silicon. In some embodiments, the first barrier layer 11 is an amorphous silicon layer and the second barrier layer 12 is an silicon oxide film. It is noted, however, that the first barrier layer 11 according to the second aspect does not always include oxygen, carbon, nitrogen, phosphorus, boron, or germanium (e.g. in some embodiments, the first barrier layer 11 may omit those elements). The fourth barrier layer 15 includes germanium, and in some embodiments, the fourth barrier layer 15 is an amorphous germanium layer. In this way, the resistance change film 6 according to the second aspect includes a first layer (fourth barrier layer 15) including germanium, and a second layer (first and second barrier layers 11 and 12) including silicon.

Comparison is now made among a first case in which the resistance change film 6 includes the first barrier layer 11, a second case in which the resistance change film 6 includes the fourth barrier layer 15, and a third case in which the resistance change film 6 includes the first and fourth barrier layers 11 and 15.

In the first case, repeating setting and resetting of the memory cell possibly increases the thickness of the second barrier layer 12 (which may be a silicon oxide film). As a result, an operating voltage of the memory cell possibly increases and the endurance characteristics of the resistance change film 6 are possibly degraded. In the second case, resistance retention characteristics after the setting or resetting of the memory cell are possibly degraded.

In comparison, the structure in the third case is implemented according to the second aspect. In this case, the first barrier layer 11 can improve the resistance retention characteristics of the memory cell, and the fourth barrier layer 15 can improve the endurance characteristics of the resistance change film 6.

It is noted that the fourth barrier layer 15 may be, for example, a germanium oxide film as an alternative to the amorphous germanium layer. In another example alternative, the fourth barrier layer 15 may be a stacked film including the amorphous germanium layer and the germanium oxide film. In any of these cases, it is possible to attain the same or similar advantages as are described above for the third case.

Figure 9:
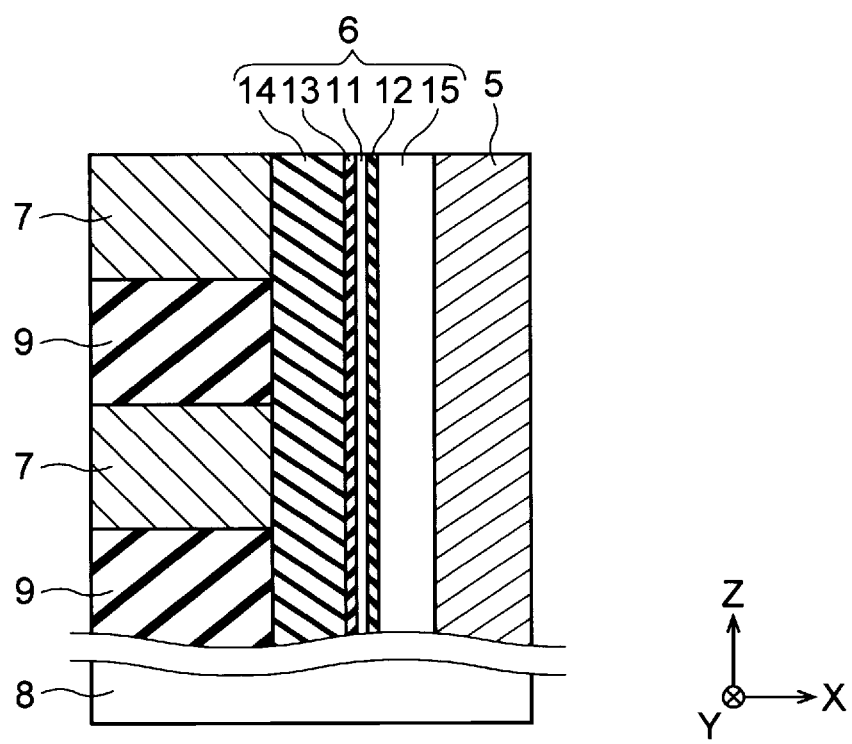
FIG. 9 is a cross-sectional view illustrating some embodiments of a structure of a semiconductor memory device according to a modification of the second aspect.

FIG. 9 is a cross-sectional view illustrating some embodiments of a structure of a semiconductor memory device 200 according to a modification of the second aspect.

The resistance change film 6 shown in FIG. 9 includes the switching layer 14, the third barrier layer 13, the first barrier layer 11, the second barrier layer 12, and the fourth barrier layer 15 provided in that order on the side surfaces of the interlayer insulating films 9 and the of word lines 7.

As can be understood, the order of the layers constituting the resistance change film 6 shown in FIG. 9 differs from the order of the layers constituting the resistance change film 6 shown in FIG. 8. It is also possible to attain the advantages described above for the third case using the resistance change film 6 shown in FIG. 9.

FIG. 10A and FIG. 10B are cross-sectional views illustrating a manufacturing method for the semiconductor memory device 200 according to the second aspect.

First, the plurality of silicon oxide films for the interlayer insulating films 9 and the plurality of titanium nitride films for the word lines 7 are alternately stacked above the substrate 8 (FIG. 10A). Next, the openings H (e.g. openings disposed along the X direction) penetrating the silicon oxide films and the titanium nitride films are formed by etching (FIG. 10A). As a result, the silicon oxide films and the titanium nitride films are each processed into a pillar shape extending in the Y direction and the Z direction, and the word lines 7 extending in the Y direction are formed.

Next, the fourth barrier layer 15 is formed on the side surfaces of the interlayer insulating films 9 and of the word lines 7 by the LPCVD (FIG. 10A). The fourth barrier layer 15 is, for example, the amorphous germanium layer and is formed using the $GeH_4$ gas.

Next, the first barrier layer 11 is formed on a side surface of the fourth barrier layer 15 by LPCVD (FIG. 10A). The first barrier layer 11 is, for example, the amorphous silicon layer and formed using the $SiH_4$ gas, the $Si_2H_6$ or aminosilane-based gas.

Next, the second barrier layer 12 (including a silicon oxide film) is formed on a side surface of the first barrier layer 11 by oxidation of part of the first barrier layer 11 (FIG. 10A). After this oxidation, another silicon oxide film may be formed on a side surface of the second barrier layer 12 by ALD (Atomic Layer Deposition) using $O_2$ gas or the like. In this case, the second barrier layer 12 is a layer that includes the two silicon oxide films.

Next, the third barrier layer 13 (aluminum oxide film) is formed on a side surface of the second barrier layer 12 by the ALD (FIG. 10B). The switching layer 14 (titanium oxide film) is then formed on a side surface of the third barrier layer 13 by the ALD (FIG. 10B). The titanium nitride film for the local bit line 5 is then formed on a side surface of the switching layer 14 (FIG. 10B).

Subsequently, openings (e.g. openings disposed along the Y direction) penetrating the fourth barrier layer 15, the first barrier layer 11, the second barrier layer 12, the third barrier layer 13, the switching layer 14, and the titanium nitride film for the local bit line 5 are formed by etching. As a result, these layers are each processed into a pillar shape extending in the Z direction, and the local bit lines 5 extending in the Z direction are formed (see FIG. 1). Various insulating films and interconnection layers are then formed on the substrate 8, thus manufacturing the semiconductor memory device 200 according to the second aspect.

As described above, the resistance change film 6 according to the second aspect includes the first layer (fourth barrier layer 15) including germanium, and the second layer (first and second barrier layers 11 and 12) including silicon. Therefore, according to the second aspect, the second layer can improve the resistance retention characteristics of the memory cell and the first layer can improve the endurance characteristics of the resistance change film 6. According to the second aspect, it is possible to realize the semiconductor memory device 200 with the resistance change film 6 exhibiting advantageous characteristics by implementing these first and second layers.

As used herein, directional terms such as "up", "down", "left", "right," "top," "bottom," "on," and "under" are used in a relative context with an assumption that a surface, on which circuitry may be formed, of a semiconductor substrate faces up, and thus these directional terms do not necessarily correspond to directions that correspond to a direction of gravitational acceleration.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented byway of example only, and are not intended to limit the scope of the present disclosure. Indeed, the embodiments and methods described in the present specification can be implemented in a variety of other forms. Furthermore, various omissions, substitutions and changes in the forms of the devices and methods described in the present specification can be made without departing from the spirit of the present disclosure, and various embodiments and aspects may be combined. The accompanying claims and their equivalents are intended to cover such forms or modifications as would fall within the scope and spirit of the present disclosure.

What is claimed is:

1. A semiconductor memory device, comprising:
   a plurality of first interconnections extending in a first direction;
   a second interconnection extending in a second direction different from the first direction; and
   a resistance change film provided between the plurality of first interconnections and the second interconnection, the resistance change film comprising silicon and a semiconductor layer comprising two or more elements selected from among oxygen, carbon, nitrogen, phosphorus, boron, and germanium,
   wherein a concentration of the selected elements included in the semiconductor layer changes along a third direction from the first interconnections to the second interconnection.

2. The semiconductor memory device according to claim 1, wherein the semiconductor layer comprises germanium and oxygen.

3. The semiconductor memory device according to claim 2, wherein the resistance change film comprises an insulating film comprising silicon and oxygen.

4. The semiconductor memory device according to claim 1, wherein the resistance change film comprises an insulating film comprising silicon and oxygen.

5. The semiconductor memory device according to claim 1, wherein the first interconnections are word lines, and the second interconnection is a local bit line.

6. The semiconductor memory device according to claim 5, further comprising a semiconductor member electronically connected to the second interconnection.

7. The semiconductor memory device according to claim 6, wherein the semiconductor member comprises a p-type section and an n-type section, and at least one of the p-type section and the n-type section directly contacts the second interconnection.

8. The semiconductor memory device according to claim 7, further comprising a gate insulating film disposed on a lateral surface of the p-type section and a lateral surface of the n-type section, the gate insulating film being coplanar with the resistance change film.

9. The semiconductor memory device according to claim 1, wherein the concentration of the selected elements included in the semiconductor layer increases along the third direction from the first interconnections to the second interconnection.

10. The semiconductor memory device according to claim 1, wherein the concentration of the selected elements included in the semiconductor layer decreases along the third direction from the first interconnections to the second interconnection.

11. The semiconductor memory device according to claim 1, wherein the concentration of the selected elements included in the semiconductor layer changes monotonically along the third direction from the first interconnections to the second interconnection.

* * * * *